(12) United States Patent
Deevi et al.

(10) Patent No.: US 8,771,846 B2
(45) Date of Patent: Jul. 8, 2014

(54) INTERMETALLIC MAGNETICALLY READABLE MEDIUM

(75) Inventors: Seetharama C. Deevi, Midlothian, VA (US); Kudumboor V. Rao, Stockholm (SE); Valter Ström, Stockholm (SE); Ziyan Gu, Kista (SE)

(73) Assignee: Philip Morris USA Inc., Richmond, VA (US)

( * ) Notice: Subject to any disclaimer, the term of this patent is extended or adjusted under 35 U.S.C. 154(b) by 2355 days.

(21) Appl. No.: 11/438,226

(22) Filed: May 23, 2006

(65) Prior Publication Data

US 2007/0072006 A1 Mar. 29, 2007

Related U.S. Application Data

(60) Provisional application No. 60/685,081, filed on May 27, 2005, provisional application No. 60/685,076, filed on May 27, 2005.

(51) Int. Cl.
*G11B 5/33* (2006.01)
(52) U.S. Cl.
USPC .................. 428/800; 428/836.1; 428/692.1
(58) Field of Classification Search
USPC .................................... 428/836, 836.1, 692.1
See application file for complete search history.

(56) References Cited

U.S. PATENT DOCUMENTS

| | | | |
|---|---|---|---|
| 5,938,726 A | 8/1999 | Reber et al. | |
| 6,030,472 A | 2/2000 | Hajaligol et al. | |
| 6,143,241 A | 11/2000 | Hajaligol et al. | |
| 6,280,682 B1 | 8/2001 | Sikka et al. | |
| 6,284,191 B1 | 9/2001 | Deevi et al. | |
| 6,332,936 B1 | 12/2001 | Hajaligol et al. | |
| 6,368,406 B1 | 4/2002 | Deevi et al. | |
| 6,489,043 B1 | 12/2002 | Deevi et al. | |
| 6,495,240 B1 * | 12/2002 | Wada et al. | 428/156 |
| 6,506,338 B1 | 1/2003 | Gedevanishvili et al. | |
| 6,607,576 B1 | 8/2003 | Sikka et al. | |
| 6,746,508 B1 | 6/2004 | Deevi et al. | |
| 6,849,349 B2 | 2/2005 | Klemmer et al. | |

FOREIGN PATENT DOCUMENTS

| | | |
|---|---|---|
| CN | 1094095 A | 10/1994 |
| EP | 1655724 A2 | 5/2006 |
| WO | WO 01/30520 A | 5/2001 |

OTHER PUBLICATIONS

International Search Report dated Jan. 16, 2007 for PCT/IB2006/002269.
Faley, M.I. et al., "High temperature superconductor dc SQUID micro-susceptometer for room temperature objects," *Supercond. Sci. Technol.*, 2004, pp. S324-S327, vol. 17.

(Continued)

*Primary Examiner* — Holly Rickman
*Assistant Examiner* — Linda Chau
(74) *Attorney, Agent, or Firm* — Buchanan Ingersoll & Rooney PC

(57) ABSTRACT

An intermetallic or iron aluminide magnetically readable medium and a method of forming and reading the same are provided herein. Also provided is an identification card or tag, a key, an anti-counterfeiting measure, an anti-forging measure. The intermetallic or iron aluminide magnetically readable medium includes a magnetically readable surface, wherein the magnetically readable surface contains one or more first magnetically readable regions of the intermetallic or iron aluminide surrounded by one or more second magnetically readable regions. Additionally, the intermetallic or iron aluminide magnetically readable medium can be coated, encapsulated or concealed within a material.

19 Claims, 13 Drawing Sheets

Variation of Vickers Hardness Number with thickness of FeAl sheet

(56) References Cited

OTHER PUBLICATIONS

García-Oca, C. et al., "The Role of Carbon and Vacancies in Determining the Hardness of FeAl Intermetallic in the Quenched and the Aged States," *Mat. Res. Soc. Symp.*, 2001, pp. N3.1.1-N3.1.6, vol. 646.

Gedevanishvili, S. et al., "Processing of iron aluminides by pressureless sintering through Fe + Al elemental route," *Mat. Sci. & Engineering*, 2002, pp. 163-176, A325, Elsevier Science B.V.

Gu, Ziyan, "Local Magnetic Susceptometry: Visualizing Functional Properties of Novel Materials," *KTH Industrial Eng. & Mgmt.*, Jun. 2005, Doctoral Thesis in Materials Science, Stockholm, Sweden (book included).

Morris, D.G. et al., "Evolution of microstructure and texture during industrial processing of FeAl sheets," *Mat. Sci. & Engineering*, 2002, pp. 573-581, A329-331, Elsevier Science B.V.

Noakes, D.R. et al., "Properties of incommensurate spin density waves in iron aluminides (invited)," *J. App. Physics*, Jun. 1, 2004, pp. 6574-6579, vol. 95, No. 11, American Inst. of Physics.

Pithawalla, Y.B. et al., "Synthesis of Magnetic Intermetallic FeAl Nanoparticles from a Non-Magnetic Bulk Alloy," *J. Phys. Chem. B*, Mar. 22, 2001, pp. 2085-2090, vol. 105, No. 11, Amer. Chemical Soc.

Reddy, B.V. et al., "Electronic structure and magnetism in $(FeAl)_n (n \leq 6)$ clusters," *Chem. Phys. Ltrs.*, Jan. 26, 2001, pp. 465-470, 333, Elsevier Science B.V.

Sikka, Vinod K. et al., "Structural Applications for General Use," *Intermetallic Compounds*, 2002, pp. 501-518, vol. 3, *Principles and Practice*, Chapter 24, John Wiley & Sons, Ltd.

Reddy, B.V. et al., "Effect of size, disorder, and impurities on magnetism in FeAl," *Physical Review B Condensed Matter & Materials Physics*, Oct. 1, 2001, pp. 132408-1 to 132408-4, vol. 64, No. 13, The American Physical Society.

Takahashi, S. et al., "The influence of plastic deformation on the magnetic properties in Fe—Al alloys," *J. Phys.: Condens. Matter*, 1990, pp. 4007-4011, vol. 2, Abstract.

Takahashi, S. et al., "Superlattice dislocations and magnetic transition in Fe—Al alloys with the B2-type ordered structure," *J. Phys.: Condens. Matter*, 1991, pp. 5805-5816, vol. 3, Abstract.

Takahashi, S. et al., "Spin distribution in plastically deformed Fe—Al intermetallic compounds," *J. Phys.: Condens. Matter*, 1996, pp. 11243-11257, vol. 8, Abstract.

Takahashi, S. et al., "Spin distribution in plastically deformed Fe—Al intermetallic compounds II," *J. Phys.: Condens. Matter*, 1997, pp. 9235-9249, vol. 9, Abstract.

Yamashita K., "Formation of antiphase-boundary tubes and magnetization in Fe-35 at.% Al by plastic deformation at 77 K," *Taylor & Francis Group*, Aug. 1, 1998, pp. 285-303, vol. 78, No. 2, Abstract.

\* cited by examiner 2 kgf 1 kgf 0.5 kgf 0.3 kgf 0.2 kgf 0.1 kgf 0.05 kgf

Stress profile of 0.0065 inch FeAl plate before annealing

Stress profile of 0.0065 inch FeAl plate after annealing indents on 0.0085 inch sheet indents on 0.0085 inch sheet form # INTERMETALLIC MAGNETICALLY READABLE MEDIUM This application claims priority under 35 U.S.C. 119 to U.S. Provisional Application No. 60/685,076, entitled Intermetallic Magnetically Readable Medium, filed May 27, 2005, the entire content of which is hereby incorporated by reference. This application also claims priority under 35 U.S.C. 119 to U.S. Provisional Application No. 60/685,081, entitled Local Magnetic Susceptometer Unit, filed May 27, 2005, the entire content of which is hereby incorporated by reference.

BACKGROUND

Iron aluminide alloys or intermetallics, such as $Fe_3Al$ and FeAl, are used as high temperature materials primarily due to their low cost, excellent mechanical properties and resistance to oxidation and corrosion, especially at high temperatures. From pure iron, the gradual substitution of Fe sites by Al results in the compound becoming paramagnetic if it contains above 33 atomic % (at. %) Al.

SUMMARY

An intermetallic or iron aluminide magnetically readable medium is provided herein.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions, wherein the one or more first magnetically readable regions define magnetically readable coding, and the one or more secondary magnetically readable regions are paramagnetic.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions, wherein the one or more first magnetically readable regions comprise one or more plastically deformed regions on the magnetically readable surface, and the one or more secondary magnetically readable regions are paramagnetic.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions, wherein the one or more first magnetically readable regions comprise a plurality of indentations, and the one or more secondary magnetically readable regions are paramagnetic.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions, wherein the one or more first magnetically readable regions provide barcode, number and/or character recognition information, and the one or more secondary magnetically readable regions are paramagnetic.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions, wherein the one or more first magnetically readable regions comprise a plurality of plastically deformed regions having the same size.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions, wherein the one or more first magnetically readable regions comprise a plurality of plastically deformed regions having the same degree of deformation.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions, wherein the one or more first magnetically readable regions comprise a plurality of plastically deformed regions having different sizes and/or different degrees of deformation.

In one embodiment, an intermetallic or iron aluminide magnetically readable medium comprises a magnetically readable surface, wherein the magnetically readable surface contains one or more first magnetically readable regions in the intermetallic or iron aluminide surrounded by one or more secondary magnetically readable regions of the intermetallic or iron aluminide, wherein the first magnetically readable regions have a higher magnetism than the second magnetically readable regions, wherein the magnetically readable surface contains one or more first magnetically readable regions of plastically deformed portions of the intermetallic or iron aluminide surrounded by one or more second magnetically readable regions of the intermetallic or iron aluminide, and wherein the one or more secondary magnetically readable regions are paramagnetic.

In one embodiment, an intermetallic or iron aluminide magnetically readable medium comprises a magnetically readable surface, wherein the magnetically readable surface contains one or more nano- or micro-size first magnetically readable regions of the intermetallic or iron aluminide surrounded by one or more second strain annealed, magnetically readable regions of the intermetallic or iron aluminide.

In one embodiment, an intermetallic or iron aluminide magnetically readable medium comprises a magnetically readable surface of an intermetallic or iron aluminide sheet/film/coating, wherein the magnetically readable surface contains one or more first magnetically readable regions of the intermetallic or iron aluminide surrounded by one or more second magnetically readable regions of the intermetallic or iron aluminide.

In one embodiment, an intermetallic or iron aluminide magnetically readable medium comprises a magnetically readable surface, wherein the magnetically readable surface contains one or more plastically deformed regions of the intermetallic or iron aluminide exhibiting permanent magnetic properties surrounded by one or more second magnetically readable regions of the intermetallic or iron aluminide exhibiting magnetically readable, paramagnetic properties.

In one embodiment, an intermetallic or iron aluminide magnetically readable medium comprises a magnetically readable surface, wherein the magnetically readable surface contains one or more indentations therein smaller than 1 mm in depth forming first magnetically readable regions of the intermetallic or iron aluminide surrounded by one or more strain annealed regions of the intermetallic or iron aluminide.

In one embodiment, an intermetallic or iron aluminide magnetically readable medium comprises a magnetically readable surface of a cold rolled sheet of intermetallic or iron aluminide, wherein the magnetically readable surface contains one or more first magnetically readable regions of the intermetallic or iron aluminide surrounded by one or more strain annealed regions of the intermetallic or iron aluminide.

In one embodiment, an intermetallic or iron aluminide magnetically readable medium comprises iron aluminide which comprises 33 to 50 atomic % aluminum.

In one embodiment, an intermetallic or iron aluminide magnetically readable medium comprises iron aluminide which comprises iron and aluminum, and further comprises Mo, Zr, C, Y, Cr, Mn, B, or combinations thereof.

In one embodiment, an intermetallic or iron aluminide magnetically readable medium comprises a coating, encapsulation or concealing material on a magnetically readable surface of the intermetallic or iron aluminide magnetically readable medium.

In one embodiment, an intermetallic or iron aluminide magnetically readable medium comprises a coating, encapsulation or concealing material on a magnetically readable surface of the intermetallic or iron aluminide magnetically readable medium, wherein the coating, encapsulation or concealing material comprises a plastic film, wherein the magnetically readable surface is capable of being read by a magnetic reader through the plastic film.

In an exemplary intermetallic or iron aluminide magnetically readable medium, a magnetically readable surface is provided, wherein the magnetically readable surface can contain one or more magnetic regions of the intermetallic or iron aluminide surrounded by one or more strain annealed regions of the intermetallic or iron aluminide. By providing one or more magnetic regions surrounded by one or more strain annealed regions, a reader can be used to differentiate the regions from one another and thus provide a reading of the intermetallic or iron aluminide readable medium.

The one or more magnetic regions can be deformation induced localized magnetism (DILM) regions formed in a strain annealed intermetallic or iron aluminide, wherein the DILM regions can be formed by plastically deforming surface regions of the intermetallic or iron aluminide. The intermetallic or iron aluminide readable medium can be formed by providing a strain annealed intermetallic or iron aluminide, then forming DILM regions therein.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises plastically deforming localized areas of the strain annealed, paramagnetic intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises forming a magnetically readable surface containing one or more DILM regions of the intermetallic or iron aluminide surrounded by one or more strain annealed, paramagnetic regions of the intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic iron aluminide comprises forming magnetically readable coding, and/or a plurality of indentations in a strain annealed, paramagnetic intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises forming barcodes, numbers and/or character recognition information in a strain annealed, paramagnetic intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises forming a plurality of plastically deformed regions having the same size in a strain annealed, paramagnetic intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises forming a plurality of plastically deformed regions having the same degree of deformation in a strain annealed, paramagnetic intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises forming a plurality of plastically deformed regions having different sizes and/or different degrees of deformation in a strain annealed, paramagnetic intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises forming a magnetically readable surface of an intermetallic or iron aluminide sheet/film/coating, wherein the magnetically readable surface contains one or more magnetically readable regions of the intermetallic or iron aluminide surrounded by one or more paramagnetic regions of the intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, and further comprises forming a strain annealed, paramagnetic intermetallic or iron aluminide by strain annealing a paramagnetic intermetallic or iron aluminide to remove local magnetism from the paramagnetic intermetallic or iron aluminide prior to forming deformation induced localized magnetism (DILM) regions in the paramagnetic intermetallic or iron aluminide.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, and further comprises forming a strain annealed, paramagnetic intermetallic or iron aluminide by strain annealing a paramagnetic intermetallic or iron aluminide to remove local magnetism from the paramagnetic intermetallic or iron aluminide prior to forming deformation induced localized magnetism (DILM) regions in the paramagnetic intermetallic or iron aluminide, wherein the forming of the strain annealed, paramagnetic intermetallic or iron aluminide comprises heating the paramagnetic intermetallic or iron aluminide at about 200° C. to about 1100° C. for about 10 minutes to about 5 hours.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises forming DILM regions in a paramagnetic iron aluminide with about 33 at. % to about 50 at. % aluminum.

Also provided is a method of forming an intermetallic or iron aluminide readable medium, comprising: forming deformation induced localized magnetism (DILM) regions in a paramagnetic intermetallic or iron aluminide, wherein the DILM regions have a higher magnetic reading than the paramagnetic intermetallic or iron aluminide, wherein the forming deformation induced localized magnetism (DILM) regions in a paramagnetic intermetallic or iron aluminide comprises forming DILM regions in a paramagnetic iron aluminide comprising iron and aluminum, and also comprising Mo, Zr, C, Y, Cr, Mn, B, or a combination thereof.

Also provided is an identification card or tag, a key, an anti-counterfeiting measure, or an anti-forging measure, comprising: an intermetallic or iron aluminide readable medium.

In one embodiment, an identification card or tag, a key, an anti-counterfeiting measure, or an anti-forging measure, comprises an intermetallic or iron aluminide readable medium, wherein the intermetallic or iron aluminide readable medium comprises an intermetallic or iron aluminide with a magnetically readable surface, wherein the magnetically readable surface contains one or more first magnetically readable regions of the intermetallic or iron aluminide surrounded by one or more second magnetically readable regions, wherein the first magnetically readable regions has a higher magnetic reading than the second magnetically readable regions, and wherein the second magnetically readable regions are paramagnetic.

In one embodiment, an identification card or tag, a key, an anti-counterfeiting measure, or an anti-forging measure, comprises an intermetallic or iron aluminide readable medium, wherein the intermetallic or iron aluminide readable medium comprises an intermetallic or iron aluminide with a magnetically readable surface, wherein the magnetically readable surface contains one or more first magnetically readable regions of the intermetallic or iron aluminide surrounded by one or more second magnetically readable regions, wherein the first magnetically readable regions has a higher magnetic reading than the second magnetically readable regions, and wherein the second magnetically readable regions are paramagnetic, wherein the one or more first magnetic regions define magnetically readable coding, one or more plastically deformed regions on the magnetically readable surface, a plurality of indentations, a barcode, a number, and/or a character recognition information.

In one embodiment, an identification card or tag, a key, an anti-counterfeiting measure, or an anti-forging measure, comprises an intermetallic or iron aluminide readable medium, wherein the intermetallic or iron aluminide readable medium comprises an intermetallic or iron aluminide with a magnetically readable surface, wherein the magnetically readable surface contains one or more first magnetically readable regions of the intermetallic or iron aluminide surrounded by one or more second magnetically readable regions, wherein the first magnetically readable regions has a higher magnetic reading than the second magnetically readable regions, and wherein the second magnetically readable regions are paramagnetic, wherein the one or more first magnetic regions comprise a plurality of plastically deformed regions having the same size, and/or a plurality of plastically deformed regions having the same degree of deformation.

In one embodiment, an identification card or tag, a key, an anti-counterfeiting measure, or an anti-forging measure, comprises an intermetallic or iron aluminide readable medium, wherein the intermetallic or iron aluminide readable medium comprises an intermetallic or iron aluminide with a magnetically readable surface, wherein the magnetically readable surface contains one or more first magnetically readable regions of the intermetallic or iron aluminide surrounded by one or more second magnetically readable regions, wherein the first magnetically readable regions has a higher magnetic reading than the second magnetically readable regions, and wherein the second magnetically readable regions are paramagnetic, wherein the one or more first magnetic regions comprise a plurality of plastically deformed regions having different sizes, and/or a plurality of plastically deformed regions having different degrees of deformation.

Also provided is a method of reading an intermetallic or iron aluminide readable medium, comprising: reading one or more magnetic, magnetically readable regions surrounded by one or more paramagnetic, magnetically readable regions in the intermetallic or iron aluminide readable medium.

Also provided is a method of reading an intermetallic or iron aluminide readable medium, comprising: reading one or more magnetic, magnetically readable regions surrounded by one or more paramagnetic, magnetically readable regions in the intermetallic or iron aluminide readable medium, wherein the reading comprises comparing voltage measurements of the one or more magnetic, magnetically readable regions to voltage measurements of the one or more paramagnetic, magnetically readable regions to determine a code, pattern, and/or text formed by the one or more magnetically readable regions in the intermetallic or iron aluminide readable medium.

DETAILED DESCRIPTION

Figure 1:
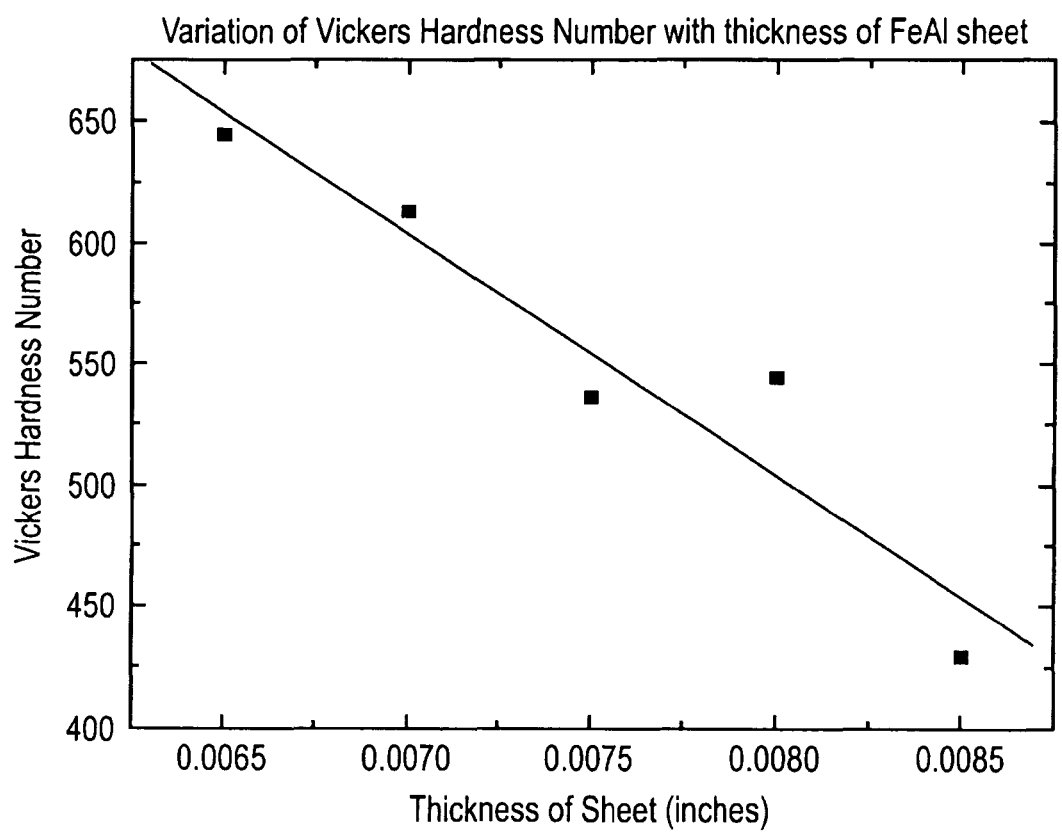
FIG. 1 illustrates a graph of Vickers Hardness Numbers as a function of exemplary thicknesses of iron aluminide sheets.
Figure 2A:
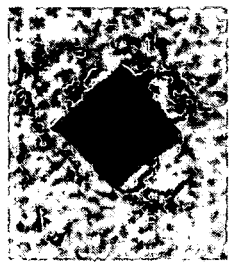
FIGS. 2(a)-2(g) are optical photomicrographs of iron aluminide sheets micro-indented on a 0.0065 inch iron aluminide plate for exemplary variations in applied test loads.
Figure 2B:
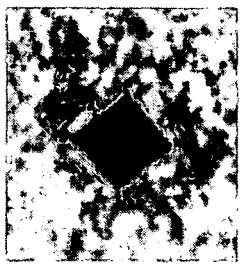
Figure 2C:
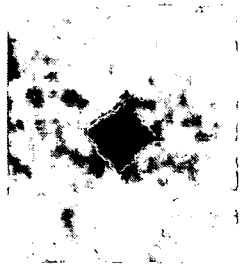
Figure 2D:
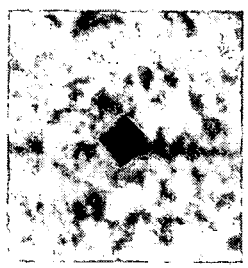
Figure 2E:
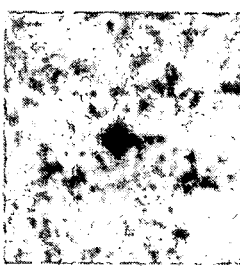
Figure 2F:
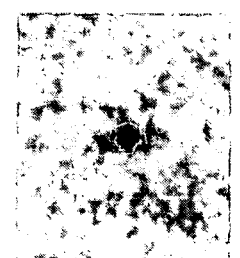
Figure 2G:

An intermetallic or iron aluminide readable medium is provided herein. A reader can also be provided for use therewith so as to read information, such as codes, patterns, etc. from the intermetallic or iron aluminide readable medium.

In an exemplary intermetallic or iron aluminide readable medium, a strain annealed intermetallic or iron aluminide is provided, wherein the surface of the intermetallic or iron aluminide readable medium is initially paramagnetic. As used herein, "strain annealed" is intended to include annealing processes that reduce strains and stresses to negligible levels. As such, an intermetallic or iron aluminide that is strain annealed would be paramagnetic.

As used herein, "paramagnetic" is intended to include properties which do not have a positive magnetic reading when measured by a magnetic reader, and thus have a "non-magnetic" or negligible magnetism reading when measured by a magnetic reader. As discussed below, an intermetallic or iron aluminide can be paramagnetic if, for example, the aluminum levels in the iron aluminide are within a predetermined range, and if the iron aluminide does not have a positive magnetic reading. As also discussed below for example, the iron aluminides with aluminum levels within the predetermined range can be made paramagnetic through strain annealing or other demagnetizing mechanisms, such as forming without magnetism by coating, etc.

By providing a paramagnetic intermetallic or iron aluminide, an essentially magnetically "blank" base medium can be provided, wherein the magnetic readings of the paramagnetic intermetallic or iron aluminide would be negligible. Thus, when one or more magnetic regions are provided within a paramagnetic intermetallic or iron aluminide, magnetically differentiable or magnetically readable information can be provided thereon.

The magnetically readable information can be machine readable, computer readable, etc. An exemplary intermetallic or iron aluminide readable medium can include a magnetically readable surface with one or more magnetic regions surrounded by one or more paramagnetic regions. Thus, using a magnetic reader, a readable surface can be read by differentiating the one or more magnetic regions from the surrounding one or more paramagnetic regions.

By providing an intermetallic or iron aluminide readable medium, identification cards or tags, anti-counterfeiting measures, anti-forging measures, etc. can be provided. For example, an intermetallic or iron aluminide readable medium can be provided in the form of an identification card, wherein patterns, codes, markings of magnetism, strain-induced magnetic regions and/or Deformation Induced Local Magnetism (DILM) regions within the intermetallic or iron aluminide readable medium can be read by a magnetic reader for identification purposes.

Some of the benefits of providing an intermetallic or iron aluminide readable medium include: 1) a small, micrometer or nanometer sized readable medium can be provided; 2) a readable medium can be provided that is not visually readable, and therefore not easily read or forged can be provided;

and 3) a magnetically readable medium can be provided, which is not demagnetizable by magnetic forces.

As discussed herein, while intermetallic materials or iron aluminides can be used for exemplary embodiment readable media, iron aluminides will be discussed below. Intermetallics can include alloys made from magnetic elements or containing at least one magnetic element as part of the alloy, wherein the alloy can be a soft magnetic or a conventional, permanent magnetic material. It is noted that intermetallic materials can similarly be used in the devices and methods described herein with respect to iron aluminides. It is also noted that intermetallics or iron aluminides can be incorporated into other materials. For example, an intermetallic can be coated, encapsulated or concealed within a material, such as plastic.

In order to form an exemplary iron aluminide readable medium, first a paramagnetic, locally magnetizable iron aluminide is provided. The paramagnetic, locally magnetizable iron aluminide can be formed from iron aluminides with about 33 at. % to about 50 at. % (i.e., about 21 weight % (wt. %) to about 32 wt. %) aluminum. It is noted that iron aluminides with less than about 33 at. % aluminum can be found to be magnetic even after strain annealing, while iron aluminides with more than about 50 at. % aluminum can be found to not form DILM regions therein by plastic deformation.

In order to provide paramagnetic, locally magnetizable intermetallic or iron aluminide, the intermetallic or iron aluminide is preferably strain annealed and paramagnetic. For example, to remove magnetism from an iron aluminide, the iron aluminide can be strain annealed.

By using a strain annealed, paramagnetic intermetallic or iron aluminide initially, "noise" or residual magnetism can be reduced in the readable medium. For example, a cold rolled sheet of iron aluminide can be strain annealed to remove strain from the iron aluminide sheet and reduce the residual magnetism in a readable medium made therefrom. As a result, noise read by a reader from paramagnetic iron aluminide should not interfere with readings by the reader of the DILM regions in a magnetically readable surface.

An exemplary iron aluminide sheet, for example, can be strain annealed at temperatures between about 200° C. and about 1100° C., as long as a sufficiently long period of time (e.g., about 10 minutes to about 5 hours) is used to obtain a featureless or non-magnetic profile. For example, a strain annealed iron aluminide can be provided by placing an iron aluminide sheet (with strains therein) between a pair of plates in an oven at 200° C. for about 5 hours to strain anneal the iron aluminide sheet.

As provided herein, an iron aluminide readable medium is provided with one or more DILM regions on a surface of the iron aluminide, wherein the magnetic differentiation between the DILM regions and the paramagnetic regions of the medium is readable. DILM regions can be formed by strain induction by plastic deformation, wherein localized strain is introduced into a surface of an iron aluminide to induce magnetic regions therein. Exemplary forms of plastic deformation can include indentation, such as micro-indention with a force applied to a surface through a micro-sized tip, or temperature strain, such as laser writing that can increase a local temperature to cause a strain.

DILM regions can be any localized strained regions formed in an otherwise paramagnetic surface of an iron aluminide readable medium. For example, DILM regions can be formed using macro-, micro- or nano-sized indentions, wherein the DILM regions can be as small as about $10^{-9}$ meters in a length direction and as small as about $10^{-9}$ in a depth direction, providing that a reader is sufficiently sensitive to provide such reading and the DILM regions are plastic deformations.

Iron aluminide media can be provided in any shape or form. For example, iron aluminide media can be provided as detailed in commonly assigned U.S. Pat. Nos. 6,143,241; 6,280,682; 6,284,191; 6,332,936; 6,368,406; 6,506,338; 6,607,576; and 6,746,508, which are hereby expressly incorporated herein for all purposes. Exemplary embodiments of iron aluminide media include iron aluminide sheets, films, or coatings, which can be formed by techniques such as hot rolling of forged ingots, hot rolling of hot extruded ingots of iron aluminide alloys, powder metallurgical processes and/or coating iron aluminide on substrates, see for example commonly assigned U.S. Pat. No. 6,489,043, which is hereby expressly incorporated herein for all purposes.

As discussed above, DILM regions can be formed by strain-inducing a localized magnetic region on a surface of an iron aluminide by plastic deformation. While not wishing to be bound by theory, it is believed that the plastic deformation leads to a strain-induced paramagnetic to ferromagnetic transition in an otherwise paramagnetic iron aluminide. It is noted that iron aluminide with about 33 at. % to about 50 at. % aluminum will display paramagnetic properties (i.e., materials that have a small but positive susceptibility which varies little with magnetizing force). However, upon strain induction, the strained DILM regions of the otherwise paramagnetic iron aluminide can be made to display ferromagnetic properties (i.e., materials that become magnetized in a magnetic field and retain their magnetism when the field is removed).

Additionally, again while not wishing to be bound by theory, it is believed that the transition from paramagnetic behavior to ferromagnetic behavior for iron aluminides in DILM regions is due to the formation of a magnetic moment of an iron atom caused by the presence of other iron atoms being in appropriate nearest neighbor (NN) sites. It is believed that the plastic deformation on the surface of a paramagnetic iron aluminide readable medium can distort a local NN interaction between iron atoms, and thus can form a ferromagnetic response, or readable magnetic level, from within the bulk of a paramagnetic material.

It is noted that the Curie point, or Curie temperature, is the temperature above which a ferromagnetic material loses its characteristic ferromagnetic ability to possess a net (spontaneous) magnetization in the absence of an external magnetic field. At temperatures below the Curie point, the material is ferromagnetic and its magnetic moments are partially aligned within magnetic domains. As the temperature is increased, thermal fluctuations increasingly destroy this alignment, until the net magnetization becomes zero at and above the Curie point. Above the Curie point, the material becomes paramagnetic.

For example, at room temperature, a $Fe_3Al$ alloy with D03 structure has a Fe atom with NN sites that include 8 NN Fe atoms and carries a magnetic moment of about $2.2\mu_B$ at room temperature (a ferromagnetic material below the Curie point). As another example, a Fe atom of a FeAl alloy has at NN sites 4 NN Fe and 4 NN Al atoms and carries a magnetic moment of $1.5\mu_B$ at room temperature (a paramagnetic material). Additionally, it is noted that the Fe atom of a $FeAl_3$ alloy has at NN sites 2 NN Fe and 6 NN Al atoms and carries a magnetic moment of about $0\mu_B$.

The terms "deformations," "plastic deformations," and "localized strains" used herein are intended to include forces sufficient to cause one or more local magnetic regions or DILM regions, such as physical forces applied thereto or thermal strains formed therein, within a paramagnetic iron aluminide. In other words, the deformations, plastic deformations and localized strains are sufficiently forceful to cause lattice disorder bringing iron atoms into NN sites, and thus cause ferromagnetic behavior.

As used herein, "local" regions is intended to include areas of lattice disorder rather than "bulk." For example, local regions can include areas of several square micrometers or nanometers. However, the deformations, plastic deformations and localized strains used herein are not forceful enough to cause lattice disorder throughout the bulk of the iron aluminide readable medium. Thus, DILM regions are provided herein as localized magnetic moments and not bulk magnetic moments.

As DILM regions can be formed by plastic deformation, the DILM regions, even though magnetic, are not changed by magnetic fields alone. Magnetic fields do not affect the magnetic properties of an iron aluminide readable medium because the magnetic properties of DILM regions are strain induced rather than field induced. Thus, a magnetically readable medium can be provided, which is not magnetizable or demagnetizable by magnetic forces. Therefore, iron aluminide readable media have magnetic properties which are "permanent" in that a measurable magnetism is displayed by the iron aluminide readable medium, and this magnetism is not affected by electromagnetic fields unlike conventional magnetic materials (e.g., ferrite ($Fe_2O_3$) magnetic tape, hard drives, etc.).

This feature can be exploited for the purposes of providing permanent, or non-magnetically erasable, identification cards, etc. as discussed above. For example, an iron aluminide readable medium can include a bar code therein, wherein the bar code can be read by a reader even after a magnetic event, such as an electromagnetic pulse (EMP), occurs, wherein the EMP may erase or demagnetize conventional magnetic readable media (i.e., hard drives, floppy disks, video tapes, magnetic strips, etc.), but does not affect the readable information stored on the iron aluminide readable medium.

Thus, as mentioned above, an iron aluminide readable medium can be used for identification cards or tags, keys, anti-counterfeiting measures, anti-forging measures, etc., which can be read by a reader. In order to protect the iron aluminide readable medium, the iron aluminide readable medium can be coated or encased to prevent accidental further plastic deformation, and thus prevent further formation of DILM regions in the iron aluminide readable medium. For example, an iron aluminide readable medium can be formed using a laser to inscribe an identification pattern within an iron aluminide, wherein the laser can cause localized plastic deformation due to heating caused by the laser. This iron aluminide readable medium can then be encapsulated in a thin plastic coating, wherein a reader can be used to read the identification pattern through the thin plastic coating.

One way to use an iron aluminide readable medium could include secured messages for high security situations. By providing an iron aluminide readable medium, the iron aluminide readable medium can visually appear to be blank so that unauthorized personnel would not be equipped to read the secured messages without the proper reader. Or, the iron aluminide readable medium can include a visually misleading message, such as an incorrect written or printed message, wherein a correct secured message can be hidden except when read by a magnetic reader.

Another way to use an iron aluminide readable medium could include anti-counterfeiting provisions. For example, an iron aluminide readable medium could be provided within monetary medium/financial instruments, such as currency, security instruments, checks, debit cards, etc., wherein the iron aluminide readable medium may not be visualized, but can be read magnetically using a magnetic reader.

Another way to use an iron aluminide readable medium includes consumer devices, such as door keys, or car ignition keys. For example, an iron aluminide readable medium can be used as a door key in that a magnetic reader can be placed on an entry door, wherein the iron aluminide readable medium can be inserted into the magnetic reader, the iron aluminide readable medium can be read, and the door can be opened. Alternatively, the iron aluminide readable medium can be used as a car key, wherein the iron aluminide readable medium can be placed within the vicinity of a reader and a car door can open and an ignition can be started without a separate key. Thus, a high security system for a car can be provided with a single, encrypted key if desired.

As discussed herein, a reader can be used for reading an iron aluminide readable medium. The reader can be a local magnetic reader to read DILM regions. For example, the local susceptometer described in commonly assigned, co-pending application Ser. No. 60/685,081 entitled "Desk Top Local Magnetic Susceptometer Unit" filed on May 27, 2005, which is hereby incorporated herein in its entirety for all purposes, can be used to read DILM regions in an iron aluminide readable medium.

By using the local susceptometer of this co-pending application, small differences can be measured, as the local susceptometer differentiates voltages between paramagnetic regions and DILM regions in order to read the iron aluminide readable medium. Additionally, the local susceptometer can be used to read the iron aluminide readable medium within a distance of about 1 cm or less.

In addition to a reader for reading an iron aluminide readable medium, a translator or computer can also be utilized in addition to the reader in order to functionally decode or translate the iron aluminide readable medium. In other words, a translator or computer can be used in conjunction with the reader to read the codes, marks, etc. in the iron aluminide readable medium. For example, a binary code can be written or encoded into an iron aluminide readable medium, wherein the binary code can be translated into text or the like by a computer and an associated program. As another example, a software program can be used to translate a code within the iron aluminide readable medium into an illustration (see discussion below with respect to FIGS. 4(a), 4(b), 6(a), 6(b), and 10(a)-(c)).

It is noted that in addition to using a computer or translator to translate a code into text, or an illustration, a computer or translator can also be included for decoding or decrypting encoded or encrypted messages that can be written or encoded into the iron aluminide readable medium as desired.

The DILM regions in the iron aluminide readable medium can be of any size or shape. For example, as mentioned above, the DILM regions can be patterns, codes, and/or markings. The patterns, codes, and/or markings can include bar codes, numbers, text, characters, lines, dots, etc. The DILM regions can be any size, such as nano-indents, micro-indents, lines, etc., and can be a plurality of patterns, codes, and/or markings, wherein the patterns, codes, and/or markings can be the same or different sizes.

Additionally, the DILM regions can have the same or different degrees of deformation. For example, nano-indents can be combined with micro-indents and text to form nano, micro- and text DILM regions with local magnetic properties. Preferably, the DILM regions are formed with one or more indentations of less than 1 mm in depth.

One advantage of using an iron aluminide readable medium is the ease of use. When a paramagnetic iron aluminide is provided, one or more DILM regions can be formed therein through plastic deformation. The plastic deformation can occur by any known method of plastically deforming iron aluminide, such as inscribing, indenting, laser writing, etc. Thus, DILM regions can be formed with or without the use of expensive tools depending upon the application desired.

Additionally, since localized strain be used to form DILM regions in otherwise paramagnetic iron aluminide readable media, the iron aluminide readable media can be coated or encapsulated after DILM regions are formed to prevent further plastic deformation. For example, after plastically deforming regions in a paramagnetic iron aluminide readable medium to form DILM regions, the iron aluminide readable medium can be enclosed, coated or encapsulated to protect the iron aluminide readable medium from being affected by further plastic deformation, and thus further formation of DILM regions.

In exemplary embodiments, the iron aluminide readable media can be provided as cold rolled, strain annealed sheets with any thickness effective to form DILM regions therein (e.g., the thickness allows an amount of force as well as the size of the deformed area to be sufficient to form DILM regions on the surface of the sheets). For example, cold rolled, strain annealed iron aluminide sheets with a thickness of between about 0.005 to about 0.01 inch can exhibit local strain-induced magnetic regions with forces of about 0.01 to about 2 kilograms force (kgf) on micro-indenting heads with a diagonal length of the tip being around 30 micrometer (μm).

As used herein, the term "iron aluminide" is intended to include any iron and aluminum alloy that can display DILM regions, preferably having an aluminum content of about 33 at. % to about 50 at. %, as mentioned above. Additionally, as used herein, iron aluminides can include minor alloying additions, if desired. Exemplary alloying additions are non-magnetic elements, such as Mo, Zr, C, Y, Cr, Mn, and/or B, wherein the alloying additions can be used to enhance solid solution strengthening, pin grain boundaries, and retain fine grain size, as well as increase grain boundary strength. Exemplary iron aluminides and processing steps that can be used are described in commonly assigned U.S. Pat. Nos. 6,143,241; 6,280,682; and 6,284,191, which are hereby expressly incorporated herein for all purposes.

Also, particles can be dispersed finely by mechanically alloying the iron aluminide. For example, an iron aluminide sheet can include Fe-40 at. % Al-0.05 at. % Zr-0.2 at. % B with small amounts of Mo (about 0.2 at. %, i.e., 0.42 wt. %) and C (0.08 wt. %) added to improve high temperature strength.

Localized strain-induced magnetic or DILM regions can be formed in paramagnetic iron aluminide readable media, as discussed above, by strain-induction, such as plastic deformation. The degree of induced strain can be adjusted to the level of magnetism, which can be read by a local magnetism reader. In other words, depending on the strain levels or the amounts of plastic deformation, in the forms of pressure, sizes of indents or deformations, the magnetic strength of localized magnetic regions can be adjusted. For example, small strain levels (e.g., micro- or nano-sized) can be result in correspondingly small, but measurable levels of magnetism. On the other hand, using the local susceptometer, larger strain levels can be measured in larger voltages.

The levels of magnetism discussed herein with respect to the DILM regions is fairly small relative to "traditional" magnets (e.g., conventional iron magnets), but is stronger than measured magnetic responses for ink-jet printed structures with magnetic ink, or hard disk pieces, for example. The level of magnetism for DILM regions is on the order of magnetic deposits in tissue sampling (i.e., during targeting), but lower than strain effects in solid cast iron samples, and magnetic fields emitted by traditional magnets, which are significantly stronger.

The magnetic forces of the DILM regions in an iron aluminide readable medium can be measured by the local susceptometer, as discussed in the co-pending application Ser. No. 60/685,081 entitled "Desk Top Local Magnetic Susceptometer Unit" filed on May 27, 2005 (previously incorporated herein). As used herein, the term "local susceptometer" is used to indicate this measuring device, which can measure localized magnetic forces in an in-plane direction (rather than in a normal direction to an iron aluminide sheet or plate).

By using the local susceptometer, the magnetism of the DILM regions can be measured with respect to a neutral reference. For example, the local susceptometer measures a DILM region voltage compared to a neutral reference (rather than a magnetic moment) to determine a level of magnetism. This method is preferred because the sensitivity measured by the local susceptometer allows susceptibility measurements (dM/dH).

It is noted that by using the local susceptometer, a three-dimensional reading can be made from an iron aluminide readable medium. This can occur because the local susceptometer can read the levels of the voltages, wherein the first two dimensions can be the planar surface of the iron aluminide readable medium, and the third dimension can be the strength of the voltage corresponding to the strain level applied.

It is noted that since the level of magnetism for DILM regions is so small, the "Bitter method" (i.e., allowing magnetic particles to be attracted to a magnetic material) may be used for micro- and/or nano-indents, but is not the most desirable method due to the lack of detail from such a measurement.

While measuring devices other than the local susceptometer, such as a Superconducting Quantum Interference Device (SQUID) measuring device, can be used to measure bulk magnetism, localized magnetic forces in an in-plane direction are measured herein using the local susceptometer. Additionally, other methods, such as Magnetic Force Microscopy (MFM), can be used for providing spatial resolution of local magnetism; however, MFM is not effective for quantifying local magnetic properties, such as magnetic strength, magnetic orientation, etc., unlike the local susceptometer discussed above.

An exemplary embodiment of forming an iron aluminide readable medium suitable for forming DILM regions may include cold rolling by manufacturing iron aluminide powders, roll compacting the iron aluminide powders, de-bindering and vacuum sintering the green sheets formed by the roll compaction of the iron aluminide powders, then cold rolling and annealing the sheets to form an iron aluminide sheet or plate. See for example, commonly assigned U.S. Pat. Nos. 6,143,241; 6,280,682; and 6,284,191, which were expressly incorporated above.

Another exemplary embodiment of forming an iron aluminide readable medium includes forming a film of iron aluminide on a substrate. By forming an iron aluminide readable medium from a thin film, readable DILM regions can be formed therein with less plastic deformation as less force would be required than for a thicker iron aluminide readable medium, such as a sheet.

In addition to providing physical forces to cause plastic deformation to form DILM regions in an iron aluminide readable medium, thermal forces can also be used to form DILM regions. For example, a laser can be used to heat localized regions in an iron aluminide readable medium. By using a laser, localized regions of the iron aluminide readable medium can be heated and cooled to induce DILM regions therein.

EXAMPLES

In this example, plastic deformation was provided in the form of micro-indents at 4 different positions of iron aluminide sheets of different thicknesses at a force of 0.2 kgf to form readable DILM regions in an iron aluminide readable medium. Therefore, different portions of each iron aluminide readable medium were tested for hardness using the same amount of force.

Using an optical microscope, the dimensions of the diagonals of the diamond-shaped indents were measured and tabulated in Table 1 below. It is noted that the support used was a rigid glass surface, as some variation in the dimensions of the indents can occur if a soft support, such as clay, is used.

TABLE 1

(Diagonal length of micro-indents at a force of 0.2 kgf)

| Thickness of sheet (inches) | Diagonal Length in μm | | | | |
|---|---|---|---|---|---|
| | Indent 1 | Indent 2 | Indent 3 | Indent 4 | Average |
| 0.0085 | 27.5 | 30.5 | 29.5 | 30 | 29.4 |
| 0.0080 | 25.5 | 26.5 | 26 | 26.5 | 26.1 |
| 0.0075 | 26 | 27 | 26 | 26 | 26.3 |
| 0.0070 | 24.5 | 25.5 | 24 | 24.5 | 24.6 |
| 0.0065 | 25 | 23 | 23.5 | 24.5 | 24 |

Using a Vickers hardness table, the Vickers hardness numbers (VHN) corresponding to the dimensions of the indents at the applied test loads (as denoted in Table 1) are tabulated in Table 2 below. It is noted that the variation of Vickers hardness with thickness of the sheet is illustrated in FIG. 1, wherein the hardness of the cold rolled iron aluminide sheets decreases with increasing thickness. In other words, the thinner sheets were harder and had higher VHN. Thus, in order to write readable DILM regions into an iron aluminide readable medium in sheet form, higher forces are needed for thinner sheets.

TABLE 2

(Vickers Hardness of Different Sheets)

| Thickness of sheet (inches) | Vickers Hardness Number | | | | |
|---|---|---|---|---|---|
| | Indent 1 | Indent 2 | Indent 3 | Indent 4 | Average |
| 0.0085 | 490 | 399 | 426 | 412 | 429 |
| 0.0080 | 570 | 528 | 549 | 528 | 544 |
| 0.0075 | 549 | 509 | 549 | 549 | 536 |
| 0.0070 | 618 | 570 | 644 | 618 | 613 |
| 0.0065 | 593 | 701 | 671 | 618 | 644 |

In addition to varying the thickness of the sheet and testing the hardness under constant levels of applied load, the applied test load can also be varied to form DILM regions in an iron aluminide readable medium. Depending upon the applied test load, the DILM regions in the iron aluminide readable medium can be varied as to size and depth. For example, higher applied loads would tend to form larger DILM regions due to the increased levels of plastic deformation in the iron aluminide readable medium.

Figure 3A:
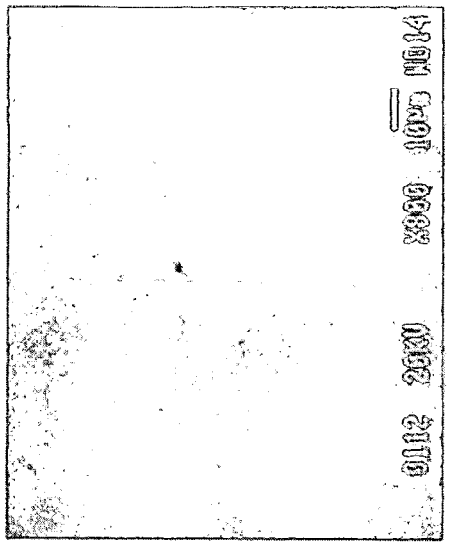
FIGS. 3(a)-3(g) are scanning electron microscope (SEM) photomicrographs of iron aluminide sheets micro-indented on a 0.0065 inch iron aluminide plate for exemplary variations in applied test loads.
Figure 3B:
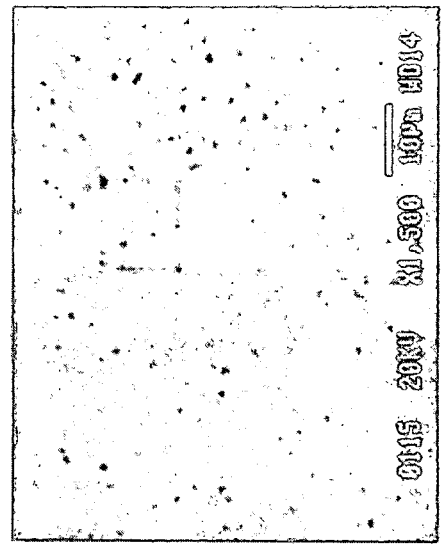
Figure 3C:
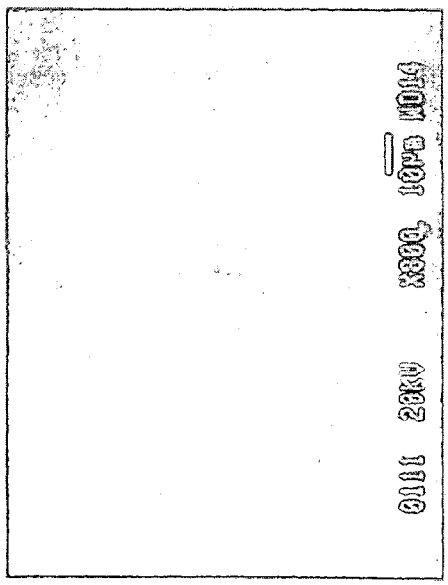
Figure 3D:
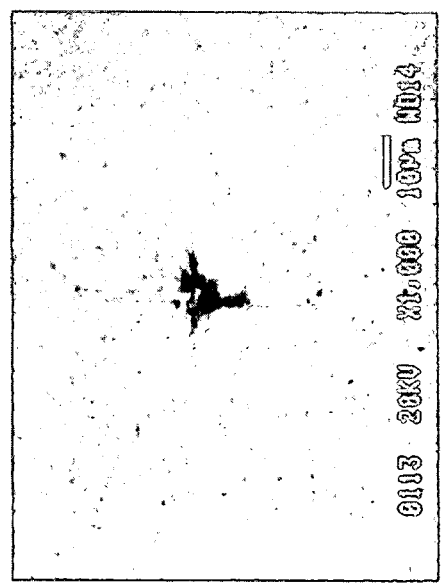
Figure 3E:
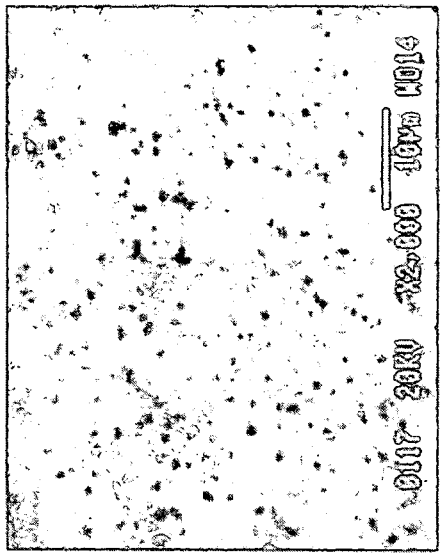
Figure 3F:
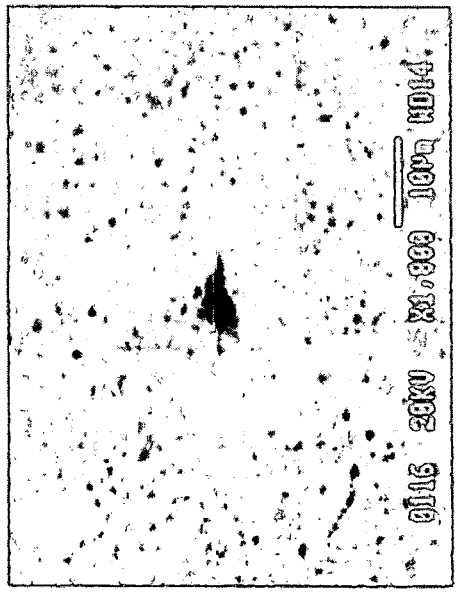
Figure 3G:
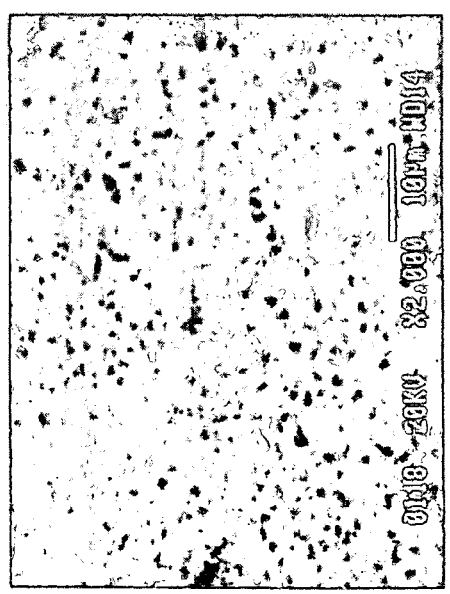
Figure 3H:
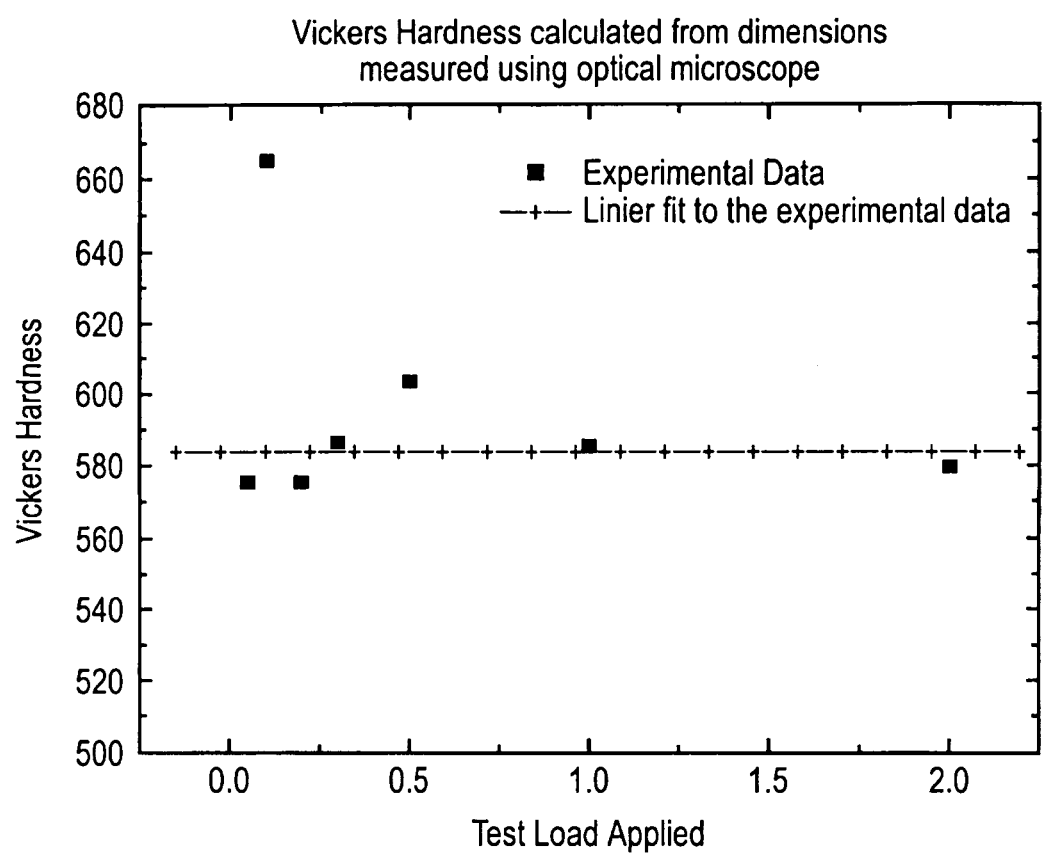
FIG. 3(h) is a graph of the Vickers Hardness Numbers as a function of test loads applied calculated using an optical microscope (illustrated in FIGS. 2(a)-(g)).

For example, a strain annealed, paramagnetic iron aluminide sheet of thickness 0.0065 inch was indented using different test loads. As tested, applied forces of 2 kgf, 1 kgf, 0.5 kgf, 0.3 kgf, 0.2 kgf, 0.1 kgf, and 0.05 kgf were applied to a strain annealed, paramagnetic iron aluminide sheet of thickness 0.0065 inch. After indenting the iron aluminide readable medium, the dimensions of the indents were measured using an optical microscope, as well as a scanning electron microscope (SEM). Values of the VHN were then calculated from the dimensions of the indents from optical microscopy and SEM images as tabulated below in Table 3. Additionally, as illustrated in FIGS. 2(a)-2(g) and FIGS. 3(a)-3(g), the variations in applied test load are illustrated with a graphical representation of the VHN vs. Test Load Applied in FIG. 3(h).

TABLE 3

(Measurement of Vickers hardness for varying applied test loads)

| | Test Load Applied | | | | | | |
|---|---|---|---|---|---|---|---|
| | 2 kgf | 1 kgf | 0.5 kgf | 0.3 kgf | 0.2 kgf | 0.1 kgf | 0.05 kgf |
| Length of Diagonal μm | 79.5 | 56.5 | 40 | 31.5 | 26.5 | 19 | 13.5 |
| Vickers Hardness No. | 587 | 581 | 579 | 561 | 528 | 514 | 509 |

It is noted that prior to forming DILM regions in an iron aluminide readable medium, residual stresses and residual magnetic regions can be removed to allow for smaller DILM regions to be read over any "noise" caused by these residual stresses and magnetic regions. In order to remove these residual stresses and magnetic regions, the iron aluminide readable medium can be strain annealed to remove residual stresses and magnetic properties. For example, a sheet of 0.0065 inch in thickness can be annealed for 5 hours at about 200° C. between two thick steel plates to remove the residual stresses prior to forming DILM regions thereon.

Figure 4A:
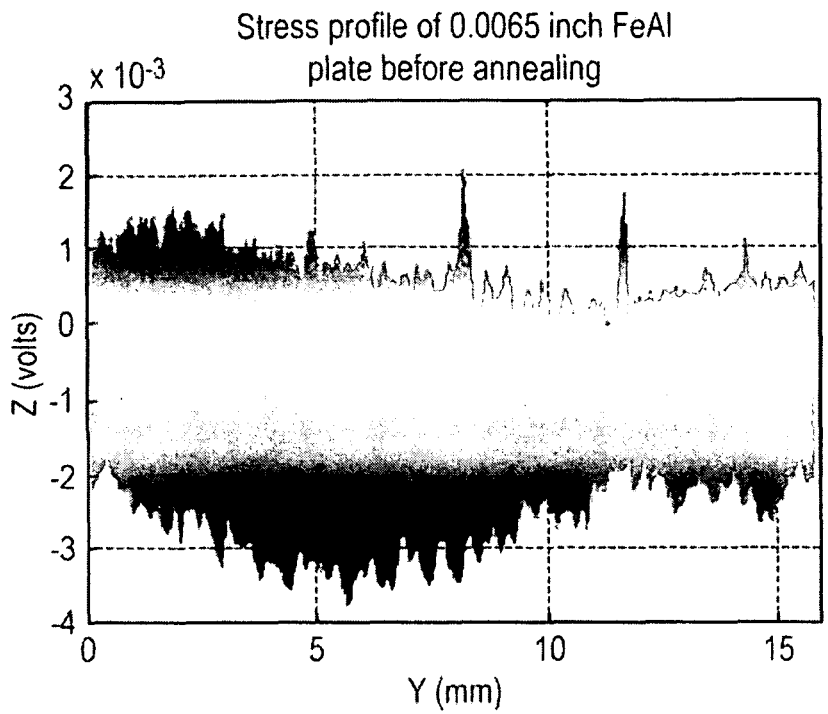
FIGS. 4(a) and 4(b) are graphs illustrating the stress profiles of a 0.0065 inch exemplary cold rolled iron aluminide sheet before annealing (see FIG. 4(a)) and after annealing (see FIG. 4(b)), respectively.
Figure 4B:
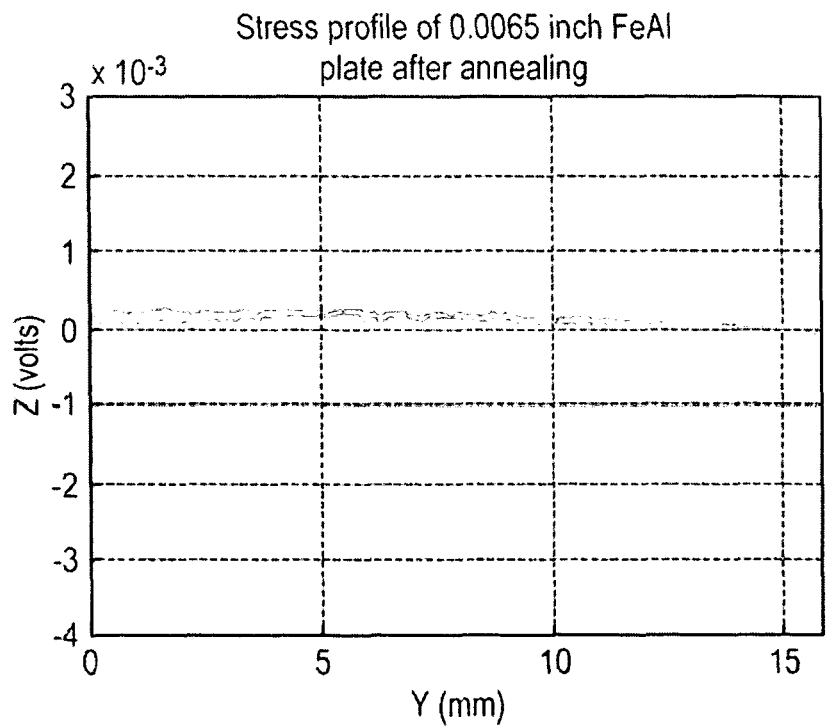

An exemplary iron aluminide readable medium before and after annealing is illustrated in FIGS. 4(a) and 4(b), which are illustrations using MATLAB ("Matrix laboratory," which is an interactive software system for numerical computations and graphics) from measurements made by the local susceptometer. In FIG. 4(a), which is before annealing, a magnetically rough surface appears illustrating a large amount of residual stresses that could interfere with DILM regions if formed therein. However, after annealing, as illustrated in FIG. 4(b), the residual stresses appear to have been relieved to a large extent, resulting in a magnetically flat surface on the iron aluminide sheet (about 0 volts throughout).

Figure 5:
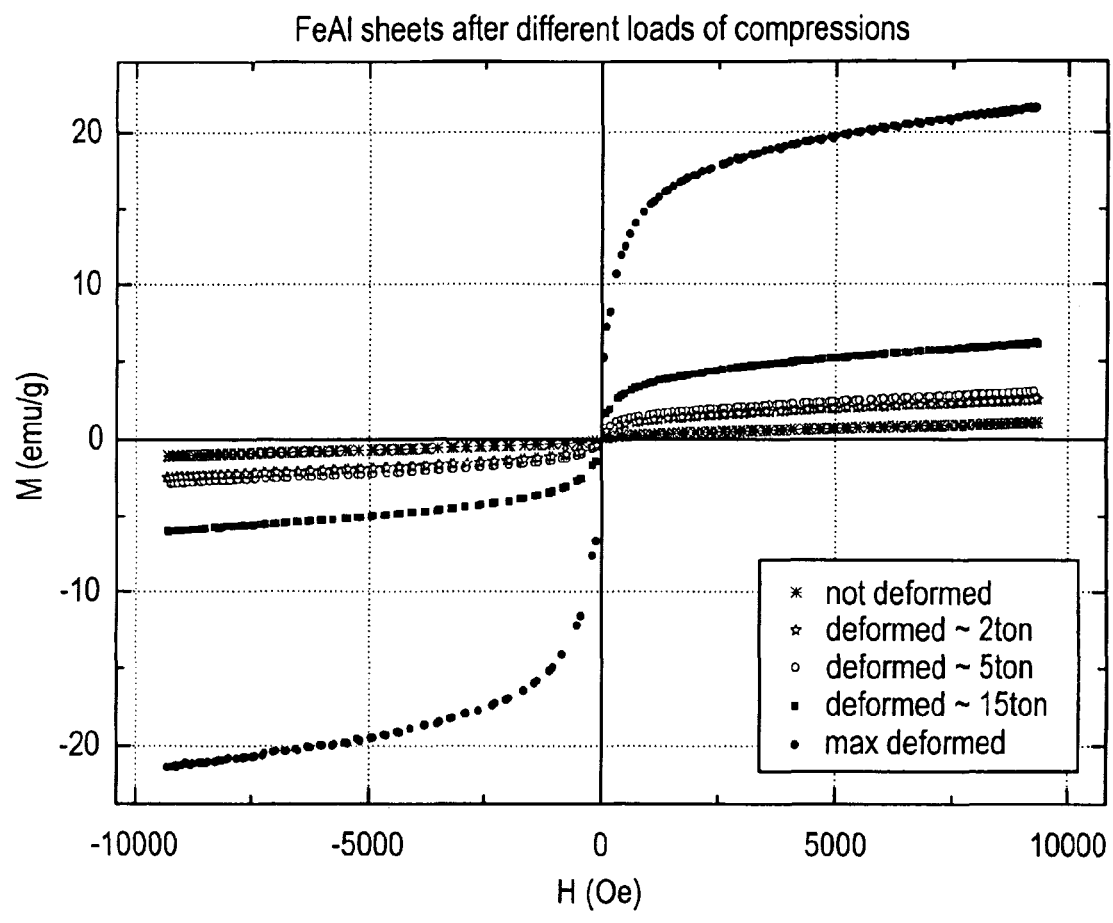
FIG. 5 is a graph of magnetic field strength or intensity (H) as a function after different loads of compression on exemplary iron aluminide sheets.

Unlike DILM regions, high levels of non-localized, bulk compression appear to cause an increase in bulk magnetism (i.e., magnetism throughout the sample). This is illustrated in FIG. 5, which illustrates the effect of high levels of non-localized compression on a bulk magnetism of an iron aluminide readable medium. In FIG. 5, the bulk magnetic field strength or intensity (H) is illustrated as a function of compression on exemplary Fe-40 at. % Al samples at room temperature (about 300K). The graph shows that induced magnetism arises from the applied loads, wherein the magnetic field strength increases as the load increases (i.e., "max deformed" has a much higher magnetic field strength curve compared to "not deformed").

Figure 6A:
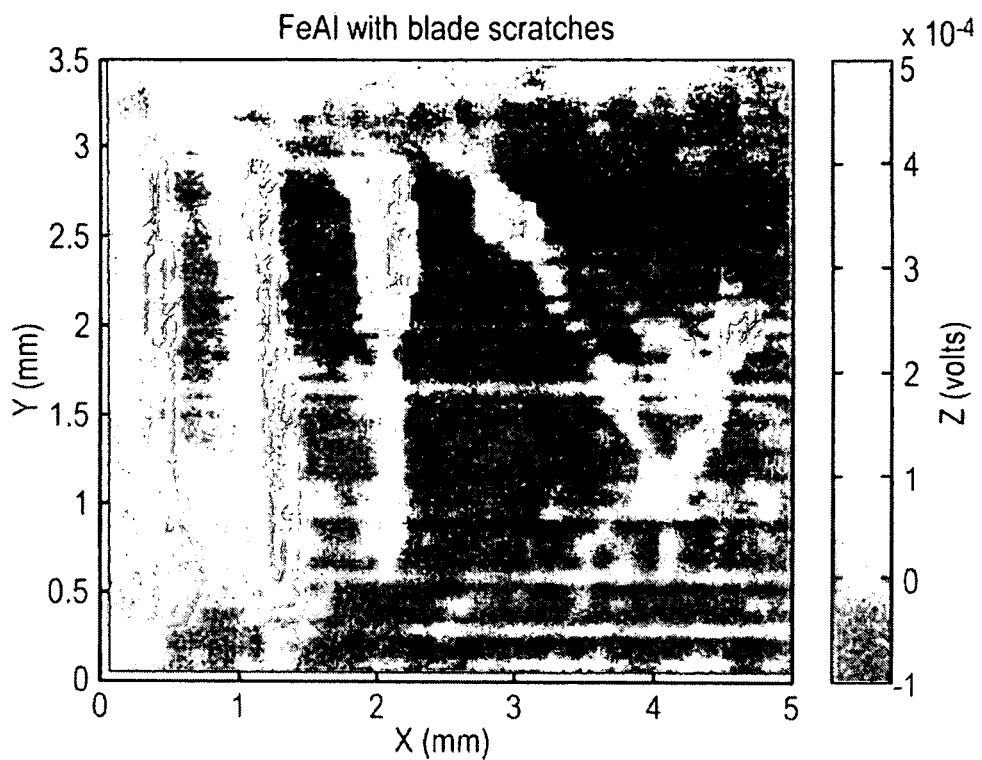
FIGS. 6(a) and 6(b) are graphs illustrating voltage readings along a surface of an exemplary iron aluminide sheet subjected to a localized plastic deformation (i.e., blade scratches) before (see FIG. 6(a)) and after heat treatment (see FIG. 6(b)).
Figure 6B:
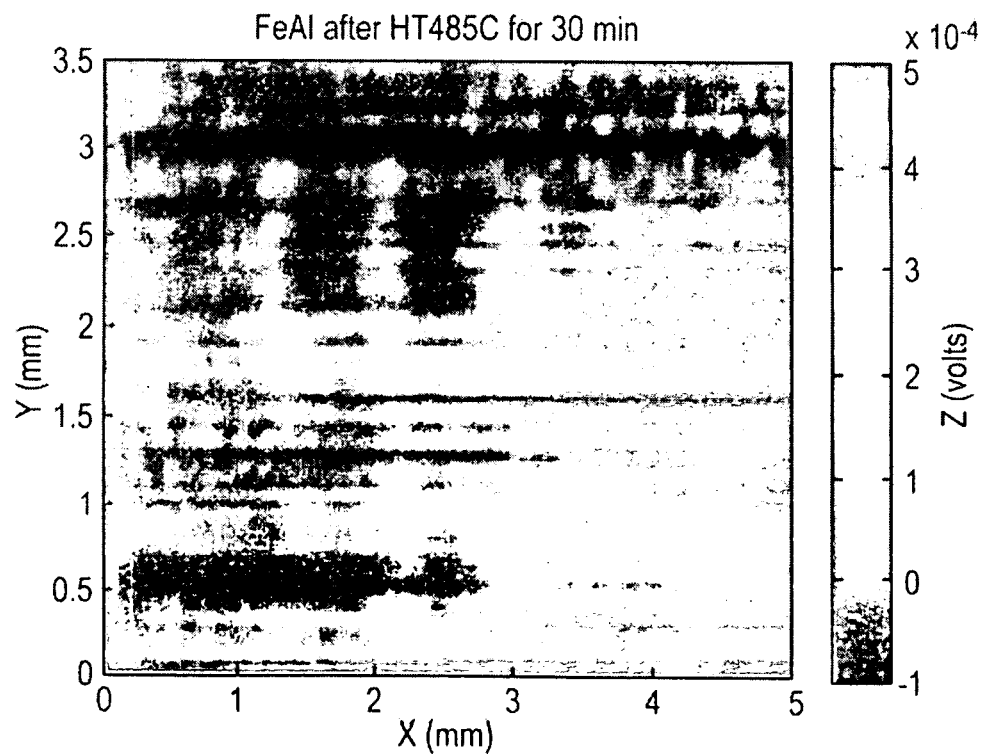

As illustrated in FIGS. 6(a) and 6(b), DILM regions can be plotted using MATLAB from measurements made by the local susceptometer. Using MATLAB, the x and y axes in these images represent two dimensions in millimeters on a sample surface. The Z scale represents the magnitude of in-plane magnetic responses (in volts) as measured by a magnetic reader reading an iron aluminide readable medium.

FIG. 6(a) illustrates a magnetic reading of DILM regions within a surface of an iron aluminide readable medium (see the vertical lines between about 0.5 mm to about 3.0 mm in the Y direction of FIG. 6(a)). The DILM regions shown in FIG. 6(a), for example, are made by scratching a surface of an iron aluminide readable medium with a standard paper clip. As illustrated in FIG. 6(a), the DILM regions can be read by a reader and translated into a visual picture using MATLAB.

Additionally, these DILM regions can be removed by heat treatment. As illustrated in FIG. 6(b), the DILM regions illustrated in FIG. 6(a) are removed from the iron aluminide readable medium by heat treating. As illustrated in FIG. 6(b), after the readable medium was annealed at about 485° C. for about 30 minutes under argon atmosphere, the DILM regions in the iron aluminide readable medium were not read by the reader (i.e., the DILM regions of FIG. 6(a) do not appear in FIG. 6(b)).

Figure 7A:
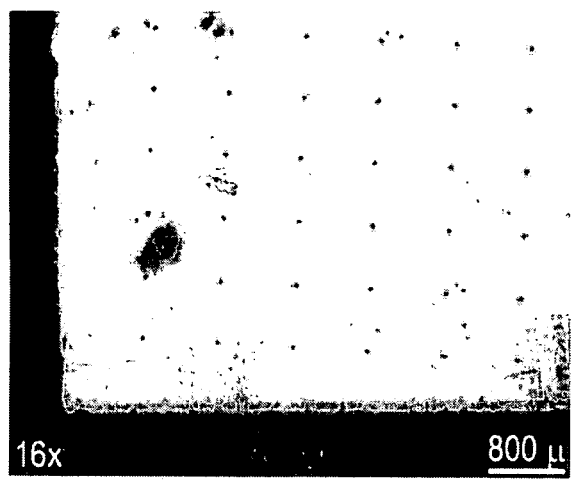
FIGS. 7(a) and 7(b) are optical photomicrographs of an array of micro-indents (see FIG. 7(a)) with a magnified image of one of the micro-indents (see FIG. 7(b)).
Figure 7B:
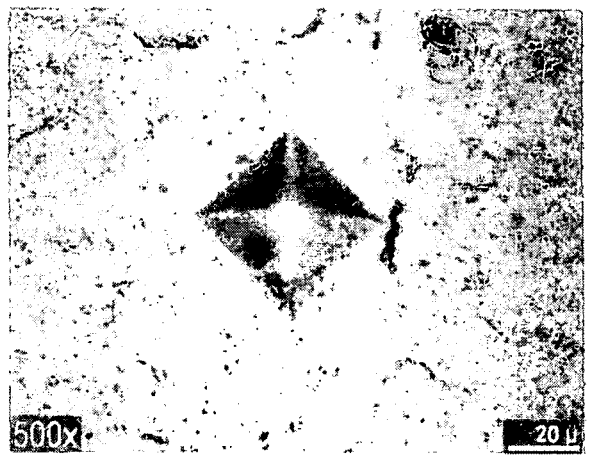

In addition to using the local susceptometer, a SQUID reader can also be used to measure magnetism. For example, the field dependence of magnetization of 0.0085 inch iron aluminide plate can be measured using a SQUID reader, both before and after plastic straining. Strains can be introduced in a strain-annealed, paramagnetic iron aluminide sheet by making micro-indents, such as an array (6×9) of micro-indents at a force of 1 kgf. See FIGS. 7(a) and 7(b), wherein FIG. 7(a) is an optical microphotograph of an array of micro-indents and FIG. 7(b) is an optical microphotograph of a magnified image of one of the micro-indents.

Figure 8A:
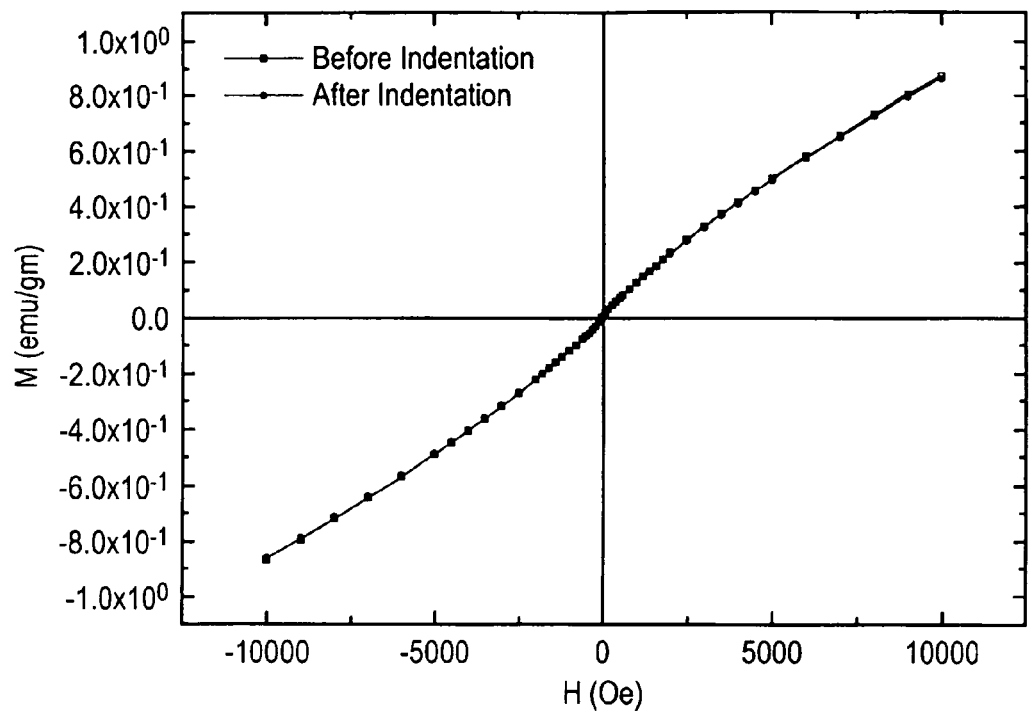
FIGS. 8(a) and 8(b) are graphs of exemplary iron aluminide sheets with magnetic field (M) dependence on magnetizing field (H) for before and after indentation.
Figure 8B:
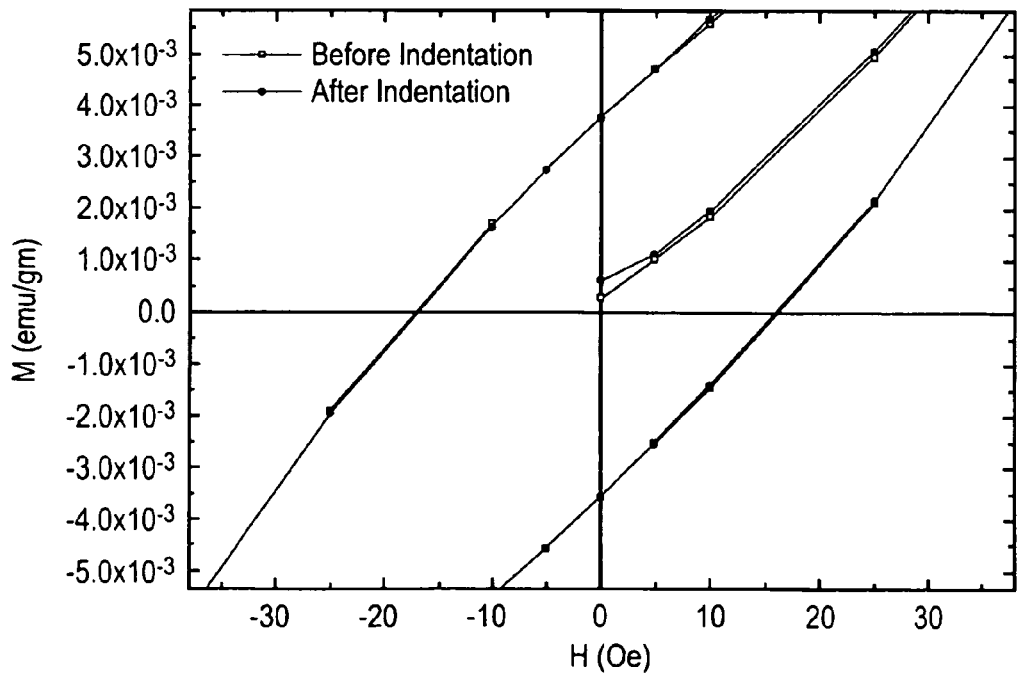

FIGS. 8(a) and 8(b) illustrate the field dependence of bulk magnetization for both before and after deformation. Iron aluminide sheets in bulk have coercivity around 16 Oe as shown in FIG. 8(b)'s right most line as it interacts with 0 emu/gm. The large paramagnetic contribution is due to the presence of $Fe_3Al$ phase. On comparison of the magnetization curves before and after straining, the bulk susceptibility appears to be unchanged, as illustrated in FIG. 8(a), wherein the change in initial slope of the magnetization curve appears to be unchanged.

Figure 9:
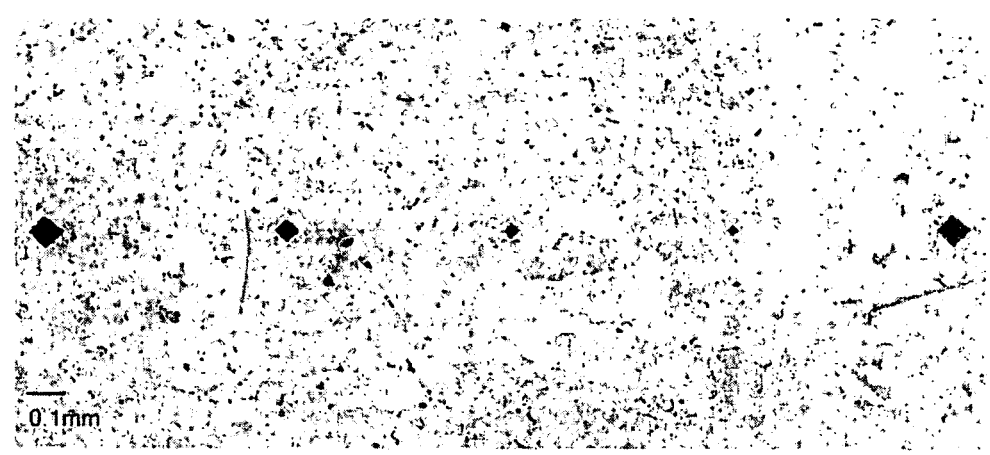
FIG. 9 is an optical photomicrograph of an exemplary iron aluminide sheets with micro-indents therein for variations in applied test loads.

In contrast, local susceptibility measurements were made after 5 micro-indents were made in a line with forces of 2 kgf, 1 kgf, 0.5 kgf, 0.3 kgf and 2 kgf in a 0.0085 inch iron aluminide readable medium. As illustrated in FIG. 9, which is an optical microphotograph of the iron aluminide readable medium, the micro-indents are largest on the left-most and right-most micro-indents, while smaller for the middle micro-indents.

Figure 10A:
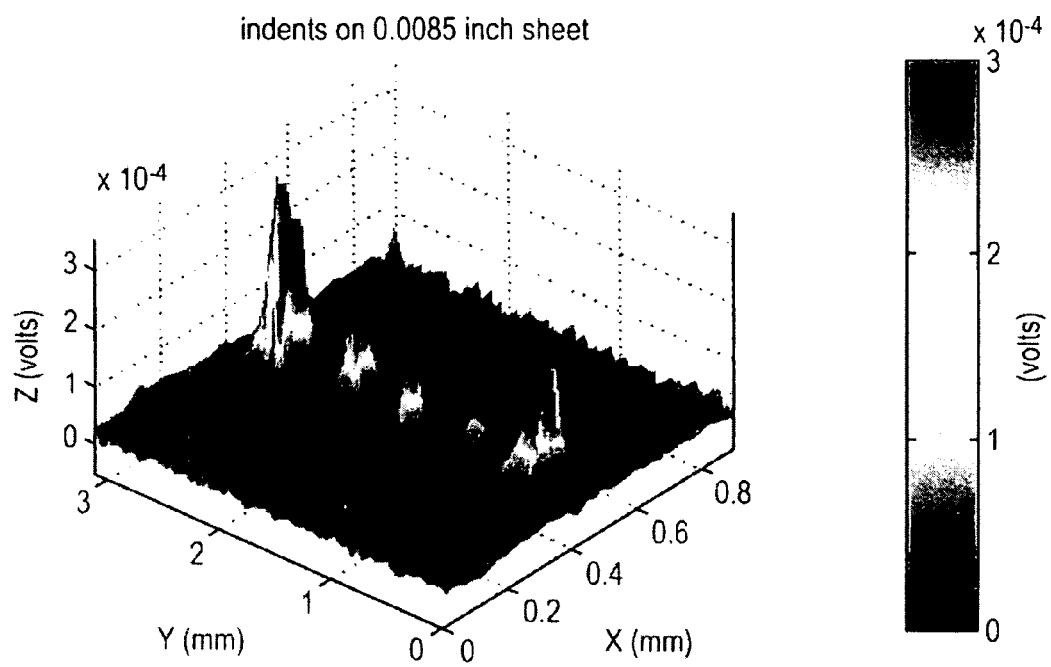
FIGS. 10(a)-10(c) are graphs of magnetic responses in the z-direction in response to micro-indent plastic deformations.
Figure 10B:
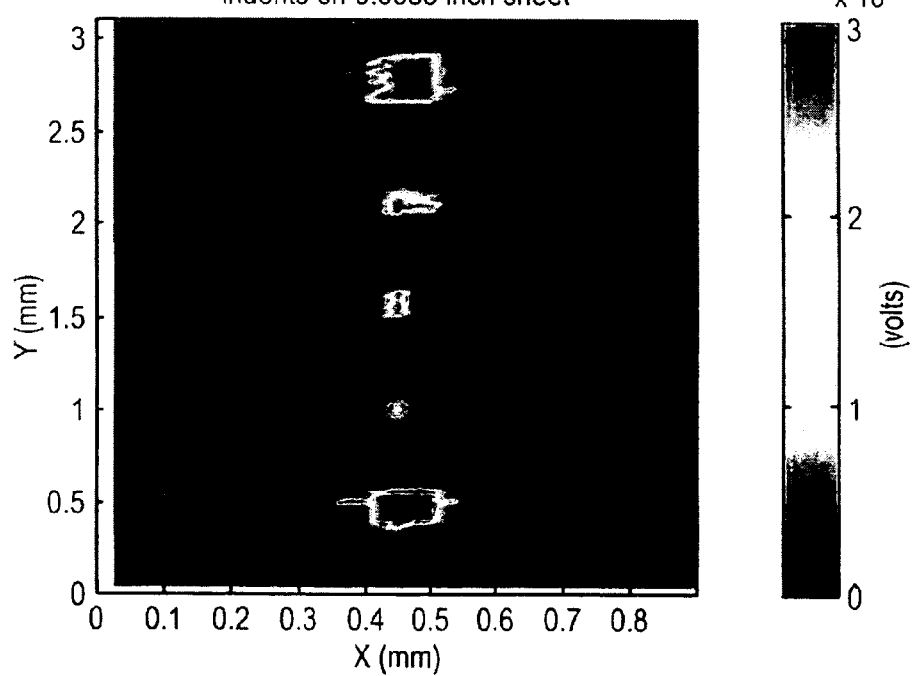
Figure 10C:
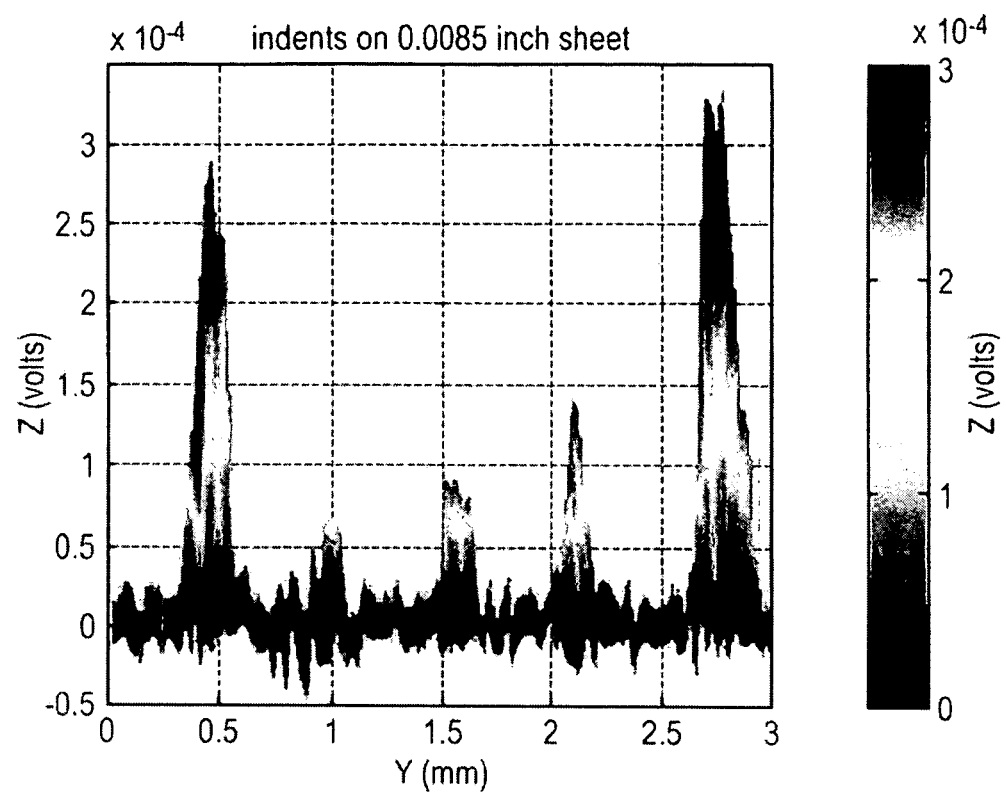

As illustrated in FIGS. 10(a)-10(c), the readable magnetism of the micro-indents in the iron aluminide readable medium of FIG. 9 is provided. The readable magnetism is read by the local susceptometer discussed above and translated into a visual picture using MATLAB, similar to FIGS. 6(a) and 6(b) as discussed above. In FIGS. 10(a)-10(c), the change in voltage for the magnetic forces caused by the micro-indents of FIG. 9 are illustrated, wherein the micro-indents are illustrated in FIGS. 10(a)-10(c).

As shown in FIGS. 10(a)-10(c) corresponding to the micro-indents of FIG. 9, high concentrations of magnetic entities in and around the micro-indents are present with little to no magnetism in non-indented regions. It is noted that the strength of the strain-induced DILM region magnetism also appears to be higher when more force is applied and thus larger deformations are formed. This is illustrated in FIG. 10(c), wherein the strains produced by the highest forces (i.e., the peaks on the left and right with a strain produced with a force of 2 kgf) have higher strain-induced DILM region magnetism compared to the strains produced by the lower forces (i.e., the peaks toward the middle with strains produced by forces of 1 kgf, 0.5 kgf, and 0.3 kgf).

It is also noted that in the examples illustrated in FIGS. 9 and 10(a)-10(c), the diagonal of the micro-indents is around 30 μm in length for each of the micro-indents. Thus, DILM regions as tested can be detected by the localized susceptometer from micro-indents at least as small as 30 μm in dimension.

It is also noted that by using SQUID, bulk magnetic measurements (M (emu/g) vs. H (Oe)) can be found, but local magnetism does not appear. Local strain-induced magnetism do not appear to be measured as there is no obvious change in the measured magnetism before (i.e., before forming local strain-induced magnetism) and after indention (i.e., after forming local strain-induced magnetism). In other words, the measurements before and after indentation appear to overlap, thus do not appear to show any change in magnetism caused by the indentation itself. Thus, the measurement by SQUID does not appear to be sensitive to local magnetic variations.

Similarly, x-ray diffraction spectrums, also do not appear to be sensitive to local magnetic variations. Similar to results using SQUID, the x-ray diffraction spectra does not appear to measure localized magnetism, as there is no obvious phase change before (i.e., with DILM regions therein) and after annealing (i.e., with the DILM regions removed). In other words, the measurements before and after annealing appear to overlap, thus do not appear to show any change in magnetism based upon the annealing.

Variations and modifications of the foregoing will be apparent to those skilled in the art. Such variations and modifications are to be considered within the purview and scope of the claims appended hereto.

What is claimed is:

1. Intermetallic magnetically readable medium comprising:
   iron aluminide,
   wherein a magnetically readable surface contains one or more indentations therein smaller than 1 mm in depth forming first magnetically readable regions surrounded by one or more strain annealed regions.

2. The intermetallic magnetically readable medium of claim 1, wherein the magnetically readable surface contains one or more first magnetically readable regions surrounded by one or more secondary magnetically readable regions, wherein the first magnetically readable regions have a higher magnetism than the second magnetically readable regions.

3. The intermetallic magnetically readable medium of claim 2, wherein:
   the one or more first magnetically readable regions define magnetically readable coding, and the one or more secondary magnetically readable regions are paramagnetic.

4. The intermetallic magnetically readable medium of claim 2, wherein:
   the one or more first magnetically readable regions comprise a plurality of plastically deformed regions having the same size and/or the same degree of deformation.

5. The intermetallic magnetically readable medium of claim 1,
   wherein the magnetically readable surface contains one or more nano- or micro-size first magnetically readable regions surrounded by one or more second strain annealed, magnetically readable regions.

6. The intermetallic magnetically readable medium of claim 1, comprising:

the magnetically readable surface of an intermetallic sheet, film, or coating, wherein the magnetically readable surface contains one or more first magnetically readable regions surrounded by one or more second magnetically readable regions.

7. The intermetallic magnetically readable medium of claim 1, wherein the intermetallic magnetically readable medium comprises an intermetallic comprising iron aluminide with 33 to 50 atomic % aluminum.

8. The intermetallic magnetically readable medium of claim 1, further comprising a coating, encapsulation or concealing material on the magnetically readable surface of the intermetallic magnetically readable medium,
wherein the magnetically readable surface is capable of being read by a magnetic reader through the coating, encapsulation or concealing material.

9. An identification card or tag, a key, an anti-counterfeiting measure, or an anti-forging measure, comprising:
an intermetallic readable medium; and
a magnetically readable surface,
wherein the magnetically readable surface contains one or more indentations therein smaller than 1 mm in depth forming first magnetically readable regions, and
wherein the intermetallic readable medium comprises an intermetallic material with the magnetically readable surface, wherein:
the magnetically readable surface contains one or more first magnetically readable regions of the intermetallic material surrounded by one or more second magnetically readable regions of the intermetallic material,
the one or more first magnetically readable regions have a higher magnetic reading than the one or more second magnetically readable regions, and wherein the second magnetically readable regions are paramagnetic, and/or
the one or more first magnetically readable regions define magnetically readable coding, one or more plastically deformed regions on the magnetically readable surface, a plurality of indentations, a barcode, a number, and/or a character recognition information; and/or
the one or more first magnetically readable regions comprise a plurality of plastically deformed regions having the same or different size and/or degree of deformation; and/or
the one or more first magnetically readable regions comprise a plurality of plastically deformed regions are not demagnetizable by magnetic forces.

10. The identification card or tag, key, anti-counterfeiting measure, or anti-forging measure of claim 9, wherein the intermetallic readable medium comprises iron aluminide.

11. The intermetallic magnetically readable medium of claim 2, wherein the one or more first magnetically readable regions comprise one or more plastically deformed regions on the magnetically readable surface, and the one or more secondary magnetically readable regions are paramagnetic.

12. The intermetallic magnetically readable medium of claim 2, wherein the one or more first magnetically readable regions comprise a plurality of indentations, and the one or more secondary magnetically readable regions are paramagnetic.

13. The intermetallic magnetically readable medium of claim 2, wherein the one or more first magnetically readable regions provide barcode, number and/or character recognition information, and the one or more secondary magnetically readable regions are paramagnetic.

14. The intermetallic magnetically readable medium of claim 2, wherein the one or more first magnetically readable regions comprise a plurality of plastically deformed regions having different sizes and/or different degrees of deformation.

15. The intermetallic magnetically readable medium of claim 1, wherein the one or more indentations are surrounded by one or more strain annealed regions.

16. The intermetallic magnetically readable medium of claim 1, comprising: the magnetically readable surface of a cold rolled sheet of intermetallic wherein the magnetically readable surface contains one or more first magnetically readable regions surrounded by one or more strain annealed regions.

17. The intermetallic magnetically readable medium of claim 1, comprising: the magnetically readable surface, wherein the magnetically readable surface contains one or more plastically deformed regions exhibiting permanent magnetic properties surrounded by one or more second magnetically readable regions exhibiting magnetically readable, paramagnetic properties.

18. The intermetallic magnetically readable medium of claim 1, wherein the intermetallic comprises iron aluminide with iron and aluminum, and the intermetallic further comprises Mo, Zr, C, Y, Cr, Mn, B, or combinations thereof.

19. The intermetallic magnetically readable medium of claim 8, wherein the coating, encapsulation or concealing material comprises a plastic film.

* * * * *